United States Patent
Blumrich et al.

(10) Patent No.: US 7,174,434 B2
(45) Date of Patent: Feb. 6, 2007

(54) LOW LATENCY MEMORY ACCESS AND SYNCHRONIZATION

(75) Inventors: Matthias A. Blumrich, Ridgefield, CT (US); Dong Chen, Croton On Hudson, NY (US); Paul W. Coteus, Yorktown Heights, NY (US); Alan G. Gara, Mount Kisco, NY (US); Mark E. Giampapa, Irvington, NY (US); Philip Heidelberger, Cortlandt Manor, NY (US); Dirk Hoenicke, Ossining, NY (US); Martin Ohmacht, Brewster, NY (US); Burkhard D. Steinmacher-Burow, Mount Kisco, NY (US); Todd E. Takken, Mount Kisco, NY (US); Pavlos M. Vranas, Bedford Hills, NY (US)

(73) Assignee: International Business Machines Corporation, Armonk, NY (US)

( * ) Notice: Subject to any disclaimer, the term of this patent is extended or adjusted under 35 U.S.C. 154(b) by 327 days.

(21) Appl. No.: 10/468,994
(22) PCT Filed: Feb. 25, 2002
(86) PCT No.: PCT/US02/05575
§ 371 (c)(1),
(2), (4) Date: Aug. 22, 2003
(87) PCT Pub. No.: WO02/069098
PCT Pub. Date: Sep. 6, 2002

(65) Prior Publication Data
US 2004/0073758 A1 Apr. 15, 2004

Related U.S. Application Data

(60) Provisional application No. 60/271,124, filed on Feb. 24, 2001.

(51) Int. Cl.
G06F 12/12 (2006.01)
(52) U.S. Cl. ..................... 711/152; 711/163

(58) Field of Classification Search ............... None
See application file for complete search history.

(56) References Cited

U.S. PATENT DOCUMENTS

| | | | | |
|---|---|---|---|---|
| 5,860,126 A * | 1/1999 | Mittal | .................. | 711/167 |
| 6,247,025 B1 * | 6/2001 | Bacon | .................. | 707/206 |
| 6,513,100 B1 * | 1/2003 | Clift | .................. | 711/154 |
| 6,782,440 B2 * | 8/2004 | Miller | .................. | 710/200 |

FOREIGN PATENT DOCUMENTS

JP 02-121053 5/1990

(Continued)

Primary Examiner—T Nguyen
(74) Attorney, Agent, or Firm—Scully, Scott, Murphy & Presser, P.C.; Daniel P. Morris, Esq.

(57) ABSTRACT

A low latency memory system access is provided in association with a weakly-ordered multiprocessor system. Each processor in the multiprocessor shares resources, and each shared resource has an associated lock within a locking device that provides support for synchronization between the multiple processors in the multiprocessor and the orderly sharing of the resources. A processor only has permission to access a resource when it owns the lock associated with that resource, and an attempt by a processor to own a lock requires only a single load operation, rather than a traditional atomic load followed by store, such that the processor only performs a read operation and the hardware locking device performs a subsequent write operation rather than the processor. A simple prefetching for non-contiguous data structures is also disclosed. A memory line is redefined so that in addition to the normal physical memory data, every line includes a pointer that is large enough to point to any other line in the memory, wherein the pointers to determine which memory line to prefetch rather than some other predictive algorithm. This enables hardware to effectively prefetch memory access patterns that are non-contiguous, but repetitive.

9 Claims, 2 Drawing Sheets

FOREIGN PATENT DOCUMENTS

| JP | 03-091055 | 4/1991 |
| JP | H 05-324572 | 12/1993 |
| JP | H 11-328141 | 4/1999 |
| KR | 1998-70206 | 10/1998 |

* cited by examiner

LOW LATENCY MEMORY ACCESS AND SYNCHRONIZATION

CROSS-REFERENCE

The present invention claims the benefit of commonly-owned, co-pending U.S. Provisional Patent Application Ser. No. 60/271,124 filed Feb. 24, 2001 entitled MASSIVELY PARALLEL SUPERCOMPUTER, the whole contents and disclosure of which is expressly incorporated by reference herein as if fully set forth herein. This patent application is additionally related to the following commonly-owned, co-pending United States patent applications filed on even date herewith, the entire contents and disclosure of each of which is expressly incorporated by reference herein as if fully set forth herein. U.S. patent application Ser. No. (YOR920020027US1, YOR920020044US1 (15270)), for "Class Networking Routing"; U.S. patent application Ser. No. (YOR920020028US1 (15271)), for "A Global Tree Network for Computing Structures"; U.S. patent application Ser. No. (YOR920020029US1 (15272)), for 'Global Interrupt and Barrier Networks"; U.S. patent application Ser. No. (YOR920020030US1 (15273)), for 'Optimized Scalable Network Switch"; U.S. patent application Ser. No. (YOR920020031US1, YOR920020032US1 (15258)), for "Arithmetic Functions in Torus and Tree Networks'; U.S. patent application Ser. No. (YOR920020033US1, YOR920020034US1 (15259)), for 'Data Capture Technique for High Speed Signaling"; U.S. patent application Ser. No. (YOR920020035US1 (15260)), for 'Managing Coherence Via Put/Get Windows'; U.S. patent application Ser. No. (YOR920020036US1, YOR920020037US1 (15261)), for "Low Latency Memory Access And Synchronization"; U.S. patent application Ser. No. (YOR920020038US1 (15276), for 'Twin-Tailed Fail-Over for Fileservers Maintaining Full Performance in the Presence of Failure"; U.S. patent application Ser. No. (YOR920020039US1 (15277)), for "Fault Isolation Through No-Overhead Link Level Checksums'; U.S. patent application Ser. No. (YOR920020040US1 (15278)), for "Ethernet Addressing Via Physical Location for Massively Parallel Systems"; U.S. patent application Ser. No. (YOR920020041US1 (15274)), for "Fault Tolerance in a Supercomputer Through Dynamic Repartitioning"; U.S. patent application Ser. No. (YOR920020042US1 (15279)), for "Checkpointing Filesystem"; U.S. patent application Ser. No. (YOR920020043US1 (15262)), for "Efficient Implementation of Multidimensional Fast Fourier Transform on a Distributed-Memory Parallel Multi-Node Computer"; U.S. patent application Ser. No. (YOR9-20010211US2 (15275)), for "A Novel Massively Parallel Supercomputer"; and U.S. patent application Ser. No. (YOR920020045US1 (15263)), for "Smart Fan Modules and System".

This invention was made with Government support under subcontract number B517552 under prime contract number W-7405-ENG-48 awarded by the Department of Energy. The Government has certain rights in this invention.

BACKGROUND OF THE INVENTION

1. Field of the Invention

The present invention relates generally to a low latency memory system, particularly in association with a weakly-ordered (loosely synchronized) multiprocessor system, and provides for efficiently synchronizing the activities of multiple processors.

The present invention also provides an efficient and simple method for prefetching non-contiguous data structures.

The present invention relates generally to the field of distributed-memory, message-passing, parallel computer design as applied, for example, to computation in the field of life sciences.

2. Discussion of the Prior Art

A large class of important computations can be performed by massively parallel computer systems. Such systems consist of many identical compute nodes, each of which typically consist of one or more CPUs, memory, and one or more network interfaces to connect it with other nodes.

The computer described in related U.S. provisional application Ser. No. 60/271,124, filed Feb. 24, 2001, for A Massively Parallel Supercomputer, leverages system-on-a-chip (SOC) technology to create a scalable cost-efficient computing system with high throughput. SOC technology has made it feasible to build an entire multiprocessor node on a single chip using libraries of embedded components, including CPU cores with integrated, first-level caches. Such packaging greatly reduces the component count of a node, allowing for the creation of a reliable, large-scale machine. A first level cache is a cache which is generally very close to the processor and is generally smaller and faster when compared to a second level cache which is further from the processor and is generally larger and slower, and so on for higher level caches.

A common problem faced by multiprocessors is the orderly sharing of resources. This is often accomplished by the use of locks, wherein a processor obtains usage permission to use a resource by acquiring a lock assigned to that resource. The processor retains permission for the resource as long as it holds (owns) the lock, and relinquishes its permission by releasing the lock. A very common type of lock is the test-and-set lock which is simple to implement and general enough to be widely applicable.

The test-and-set lock generally relies upon a hardware read-modify-write (RMW) operation for its implementation. This operation allows a value to be written to a memory location, and returns the value that was previously in that location (before the write). That is, the operation consists of a read followed immediately and without interruption, by a write.

The semantics of a test-and-set lock are as follows. Say the unlocked condition is 0 and the locked condition is 1. A processor attempts to acquire the lock by performing a RMW operation to the lock, wherein the value written is 1. If the value returned is 0, then the lock was unlocked before the RMW, and it has been locked due to the write of 1. If the value returned is 1, then the lock was already locked and the write had no effect. To release the lock, a 0 is simply written.

Another aspect of the present invention involves prefetching, which is a well known technique for enhancing performance of memory systems containing caches, especially when applications exhibit a predictable access pattern. In general, prefetching is accomplished either through the use of software directives, or though special hardware. Some hardware schemes are straightforward, such as sequential prefetching, and some are more sophisticated, such as strided stream buffers. However, all of the hardware techniques rely upon the predictability of the address sequence. See Vanderwiel and Lilja for a through survey of conventional prefetching techniques.

Modern virtual memory systems can affect the effectiveness of hardware prefetching because large data structures that are contiguous in virtual memory need not be contiguous in physical memory, and hardware prefetching usually deals with physical memory addresses. Even if a large data structure is traversed contiguously, as is often the case, the actual memory references will not be contiguous and hence, difficult to predict. However, many applications have highly repetitive behavior, so a mechanism that can learn the repeating access pattern could prefetch effectively.

One such mechanism is described in U.S. Pat. No. 4,807,110, Pomerene et al., for a Prefetching System for a Cache Having a Second Directory for Sequentially Accessed Blocks. The idea is to provide a large, two-level table that stores relationships between consecutively accessed cache lines and allows those relationships to be exploited for prefetching into a cache. Various methods for establishing and maintaining the relationships are described. A significant drawback of this approach is that the table is of fixed size, and eventually fills up. At that point, known relationships must be evicted to make room for new ones. This is not a problem as long as the table is large enough to capture a working set, but the working set of many scientific applications, such as those that will be run on the scalable computer described in related U.S. provisional application Ser. No. 60/271,124, filed Feb. 24, 2001, for A Massively Parallel Supercomputer, can be as large as the main memory. In this case, the table will provide little benefit as follow-on relationships between cache lines will be evicted due to limited capacity long before they can be used for prefetching.

SUMMARY OF THE INVENTION

Accordingly, it is a primary object of the present invention to provide low latency memory system access, particularly in association with a weakly-ordered multiprocessor system. Memory latency is generally known as the time required by a digital computer to deliver information from its memory, or the interval between the time at which a Central Processing Unit (CPU) initiates a request for memory data and the time at which the memory system returns the data to the CPU.

Each processor in the multiprocessor shares resources, and each shared resource has an associated lock within a locking device. The lock provides support for synchronization between the multiple processors in the multiprocessor, and the orderly sharing of the resource. A processor only has permission to access a resource when it owns the lock associated with that resource, and an attempt by a processor to own (a.k.a., acquire) a lock requires only a single load operation, rather than a traditional atomic load followed by store, such that the processor only performs a read operation and the hardware locking device performs a subsequent write operation rather than the processor.

A further object of the subject invention is the provision of a simple mechanism for prefetching non-contiguous data structures, such as very large data structures that are stored non-contiguously but accessed repeatedly in the same order. The basic idea is to embed pointers in the data structure to indicate the access order, and prefetch the targets of the pointers.

Prefetching is generally based on cache lines, wherein a line is an aligned chunk of contiguous physical memory locations. The entire memory of a system can be thought of as divided into lines, where some portion of those lines are stored in caches (and possibly modified) at any given time. The present invention redefines a memory line so that in addition to the normal physical memory data, every line includes a pointer that is large enough to point to any other line in the memory. In addition to the data and the pointer, there could be some additional bits to implement the algorithm that sets and uses the pointers. For example, a preferred embodiment described herein includes two bits to indicate the status of the pointer. The basic idea is to use the pointers to determine which memory line to prefetch rather than some other predictive algorithm. This enables hardware to effectively prefetch memory access patterns that are non-contiguous but repetitive. A preferred embodiment of the invention includes a mechanism to detect access patterns and set the memory line pointers automatically. In addition, a mechanism allows the pointers to be set statically by software.

BRIEF DESCRIPTION OF THE DRAWINGS

The foregoing objects and advantages of the present invention for low latency memory and synchronization may be more readily understood by one skilled in the art with reference being made to the following detailed description of several embodiments thereof, taken in conjunction with the accompanying drawings wherein like elements are designated by identical reference numerals throughout the several views, and in which.

DETAILED DESCRIPTION OF THE INVENTION

A multiprocessor on a chip offers an opportunity to improve the performance of locking by including custom hardware to implement the locks. This hardware can be located near the processors, such as between the individual processors, resulting in extremely low latency access. Furthermore, locks can be implemented that do not require the atomic (performed without interruption) read-modify-write (RMW) operation, but work with ordinary loads and stores.

The present invention is being developed in association with a multiprocessor system-on-chip (SOC) cache structure. The multiprocessor system includes two CPU cores, each having an internal first-level cache, wherein each processor has separate write and read buses which operate relatively independently. It should be understood that the present invention will work with more than two CPU cores. The present invention provides a hardware locking device that provides support for synchronization between multiple processors in a multiprocessor, such as a multiprocessor SOC. The hardware locking device can be located between the individual processors to reduce latency to a minimum. The hardware locking device allows each processor to simply perform a read operation to acquire a lock, as the associated write operation is implicit and performed by the hardware locking device. The locking device can be implemented very efficiently on a chip, or could also be implemented as a stand-alone device.

Figure 1:
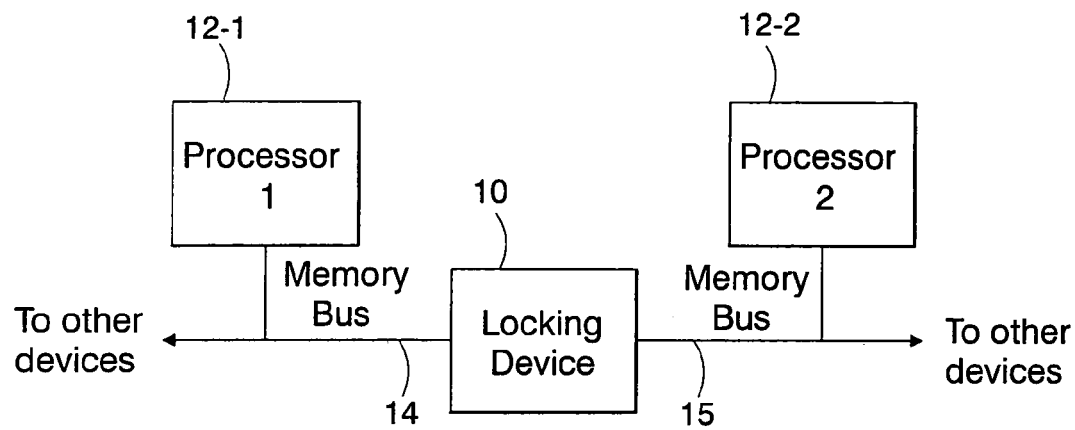
FIG. 1 shows how a locking device is connected to and accessed by two processors.

FIG. 1 shows how a shared locking device is connected to and accessed by two processors 12-1, 12-2 over their memory buses 14, 15. The locking device 10 is connected to the memory bus 14 of processor 1 like any other addressable device. Similarly, the locking device 10 is connected to the memory bus 15 of processor 2 like any other addressable device. An address range is reserved for lock device access within each of the processors. The locking device contains some number of independent locks which are accessible through ordinary memory loads and stores. This is often called "memory-mapped input/output". Each lock is accessible through two distinct addresses: an active address and a passive address. This active address allows a processor to first acquire and then release a lock, whereas the passive address provides only the current status of the lock.

Figure 2:
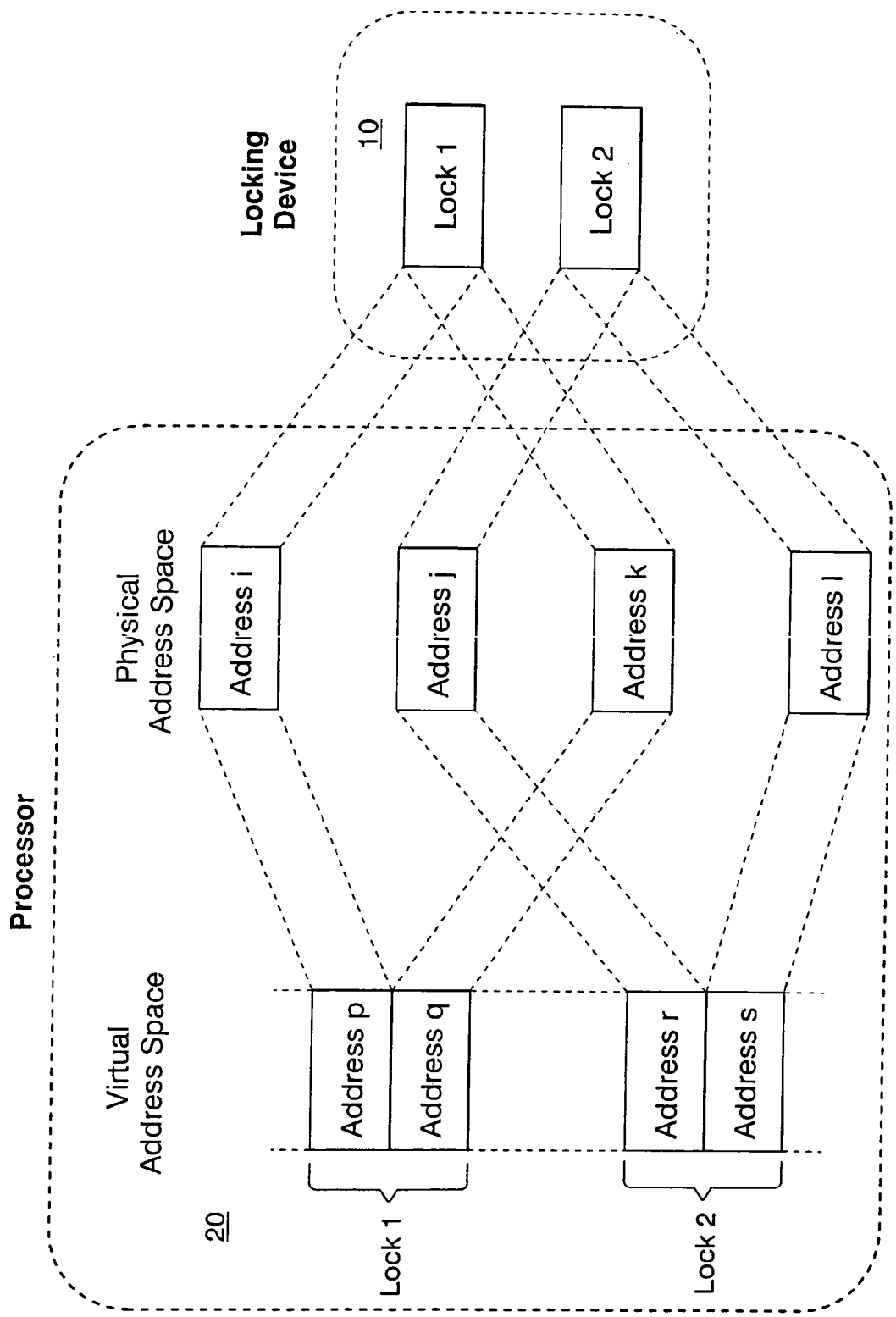
FIG. 2 illustrates an example of address mapping of locks, and shows how a number of locks are mapped into the address space of a processor.

FIG. 2 shows a typical mapping of two locking device locks 1,2 into the address space of a processor 20. Each lock is accessible through two physical addresses, one active and one passive. All the active addresses are grouped together in the physical address space to allow the locking device 10 to easily decode an active access. Similarly, all the passive addresses are grouped together in the physical address space. In FIG. 2, physical addresses i and j are active addresses while physical addresses k and l are passive.

An application might like to pair the active and passive addresses for a lock together in its virtual address space, as shown in FIG. 2. Here, the active address for Lock 1 is virtual address p, and its passive address is virtual address q. Similarly, the active and passive addresses for Lock 2 are virtual address r and virtual address s, respectively.

Because the locking device is accessible through virtual memory, the operating system controls access to locks through virtual memory mappings. Note that the mappings from virtual to physical addresses in FIG. 2 are provided by the normal mechanisms found in typical memory management units. The mapping from physical addresses to the locking device are determined by the address decoders of the locking device. One such typical mapping is to provide a single lock access address per operating system page. This allows the operating system maximum flexibility in assigning locks to applications in a protected manner. Note that many other mappings are possible, and that multiple processors can use different mappings subject to locking device decoding constraints.

To attempt to acquire a particular lock, a processor reads the active address of that lock. This read performs an implicit read-modify-write (RMW) of 1, and returns the prior state of the lock. On success, 0 is returned; on failure 1 is returned. To release the lock, a 0 is written to the active address of the lock. Reads to the passive address corresponding to a lock simply return the current state of the lock without modifying it.

Processors do not need to use the same addresses to refer to the locks in the locking device, but must agree on which of the available locks to use for any particular purpose so that they can share that particular lock. The locking device is very efficient because lock acquire attempts require only a single load (read) operation, rather than the traditional atomic load (read) followed by store (write), such that the processor only performs a read operation and does not need to perform a subsequent write operation which is performed instead by the hardware lock. This is particularly advantageous when a processor has separate write and read buses, the operations of which would have to be coordinated to provide an atomic RMW, which would result in increased latency.

The present invention also relates to and provides a mechanism for effective prefetching of very large data structures that are stored non-contiguously, but accessed repeatedly in the same order. The basic idea is to embed pointers in the data structure to indicate the access order, and prefetch the targets of the pointers.

Prefetching is generally based on cache lines, where a line is an aligned chunk of contiguous physical memory locations. The entire memory of a system can be thought of as divided into lines, where some portion of those lines are stored in caches (and possibly modified) at any given time.

Figure 3:
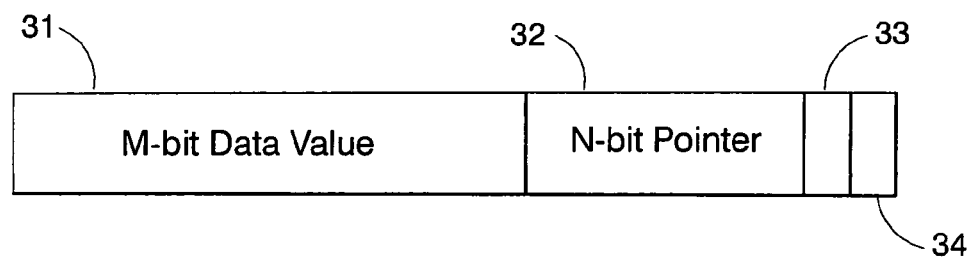
FIG. 3 illustrates a further concept of the invention wherein a memory line is redefined so that in addition to the normal physical memory data, every line includes a pointer that is large enough to point to any other line in the memory.

FIG. 3 illustrates one concept of the invention wherein a memory line is redefined so that in addition to the normal physical memory data 31, every line includes a pointer 32 that is large enough to point to any other line in the memory. The line of FIG. 3 contains M bits of data and is one of $2^N$ (two to the power of N) such memory lines that make up the total memory. In addition to the data and the pointer, bits could be provided to implement the algorithm that sets and uses the pointers. For example, a preferred embodiment described herein includes two bits 33, 34 to indicate the status of the pointer.

The basic idea is to use pointers to determine which memory line to prefetch rather than a prediction algorithm. This enables hardware to effectively prefetch memory access patterns that are noncontiguous, but repetitive. A preferred embodiment of the invention includes a mechanism to detect access patterns and set the memory line pointers automatically. In addition, a mechanism allow the pointers to be set statically by software.

A memory line and its associated pointer remain together as the line is moved up the memory hierarchy. For example, prefetching could be used to improve the hit ratio of a second-level cache near a CPU, so any other caches below that one, such as third-level, would simply cache the pointer along with the memory line data. The second-level cache would also store the pointer in order to implement status changes, as described below.

A simple mechanism to set the pointers automatically begins with all of the pointers being considered "invalid". An invalid pointer is never used for prefetching. This can be indicated with an additional bit, or by dedicating a particular pointer value to this condition. When a line is accessed and the line has no valid pointer, the line is promoted to "parent" status. The next line that is demand fetched is considered to be its "child". Once the child is known, the pointer of the parent is modified to point to the child and made valid. In addition, a "probation" bit is set to indicate that the pointer is a guess and may not be useful. Note that the algorithm is recursive in that the child is also a parent of another, subsequent line.

When a line is referenced, and possibly fetched, with a probation pointer set, the line is again considered to be a parent, but the child is not fetched. Once the next line is requested, its address is compared with the probationary child pointer. If they match, then the parent's pointer is promoted to "known" status. If they do not match, then the parent's pointer is marked invalid because it is assumed that the prefetch would be useless.

When a line is referenced, and possibly fetched, with a known pointer, the child that is pointed to is immediately prefetched. If the next line to be referenced is not that child, then the parent's pointer status is downgraded to probationary status again.

This simple scheme allows no room for variations in the access pattern and does not support a prefetching depth (i.e. number of prefetches outstanding, typically 3 or 4) of more than one. The simple scheme can be enhanced to include a small content-addressable prefetch table that keeps track of parent-child relationships for some period of time. The table has three fields: parent, child, and status.

When a line is fetched and it has an invalid pointer, then it is treated the same as in the simple scheme. That is, the next line to be fetched is considered its child, the parent's pointer is set to the child, and the pointer status is set to probationary. When a line is fetched or prefetched with a known pointer, then the child pointed to is immediately prefetched, unless the prefetch depth has been exceeded.

When a line with a probationary or known pointer is fetched and it is not found as a parent in the prefetch table, then it is entered into the table along with its child pointer and pointer status.

Whenever a line is referenced, and possibly fetched, the line's address is compared to all the child pointers in the prefetch table. If a match is found, then the associated parent's status is updated as in the simple scheme. That is, a probationary pointer is upgraded to known status. In addition, the matching entry in the prefetch table is removed. If more than one child entry is matched, then each is handled in the same manner.

When an entry is evicted from the prefetch table due to capacity, the parent's pointer status is updated as in the simple scheme when the next reference did not match the expected child. That is, a valid pointer is made probationary, and a probationary pointer is invalidated. When a line is evicted from the cache and that line is found as a parent in the prefetch table, then the table entry is also invalidated and treated as a prefetch table eviction.

The prefetch hardware includes a mode of operation that presets the prefetch pointers and respects the preset prefetch pointers, but does not change their status. That is, the automatic pointer setting mechanism is disabled, but the prefetch mechanism based on the pointers is not. This is useful when the virtual-to-physical mapping of a data structure is fixed, and the traversal order of the data structure is known. In this case, the pointers in physical memory can be set to correspond to the access order, allowing the data structure to be prefetched effectively.

While several embodiments and variations of the present invention for a low latency memory system access and a simple prefetching for non-contiguous data structures are described in detail herein, it should be apparent that the disclosure and teachings of the present invention will suggest many alternative designs to those skilled in the art.

Having thus described our invention, what we claim as new and desire to secure by Letters Patent is:

1. A multiprocessor wherein each processor in the multiprocessor shares resources, comprising:

a hardware locking device that provides support for syncronization between the multiple processors in the multiprocessor and the orderly sharing of the resources, wherein a processor only has permission to access a resource when it owns a lock associated with that resource, said lock corresponding to a memory address in a memory address space, and an attempt by a processor to own the lock requires only a single load operation, rather than a traditional atomic load followed by store, such that the processor only performs a read operation and the hardware locking device performs a subsequent write operation rather than the processor, wherein a processor has more than one lock available to use for a particular purpose, so that multiple processors need not use a same memory address to refer to a lock in the locking device.

2. The multiprocessor of claim 1, wherein the hardware locking device is implemented in a weakly-ordered multiprocessor system.

3. The multiprocessor of claim 1, wherein the hardware locking device comprises a test-and-set lock which relies upon a memory read by a processor for its operation, and automatically writes a value to the lock and returns the value that was previously stored in the lock before the write.

4. The multiprocessor of claim 1, wherein the hardware locking device is implemented as part of a chip.

5. The multiprocessor of claim 1, wherein the hardware locking device is implemented in a stand-alone device.

6. The multiprocessor of claim 1, wherein each processor has separate write and read buses, the operations of which are relatively independent.

7. The multiprocessor of claim 1, wherein the multiprocessor comprises a multiprocessor system on-chip (SOC) structure.

8. The multiprocessor of claim 7, wherein the multiprocessor system includes two CPU cores, each having an internal first-level cache, and each processor has separate write and read buses which are relatively independent.

9. The multiprocessor of claim 1, wherein said lock is accessible through a virtual memory space, an operating system controlling access to locks through a virtual memory mapping.

* * * * *